United States Patent [19]

Clemons et al.

[11] 4,222,112

[45] Sep. 9, 1980

[54] DYNAMIC RAM ORGANIZATION FOR REDUCING PEAK CURRENT

[75] Inventors: Donald G. Clemons, Walnutport; Frank J. Procyk, Center Valley, both of Pa.

[73] Assignee: Bell Telephone Laboratories, Incorporated, Murray Hill, N.J.

[21] Appl. No.: 10,741

[22] Filed: Feb. 9, 1979

[51] Int. Cl.[2] .............................................. G11C 7/02
[52] U.S. Cl. ................................... 365/189; 365/194; 365/203
[58] Field of Search ................. 365/203, 194, 206, 189

[56] References Cited

U.S. PATENT DOCUMENTS

| | | | |
|---|---|---|---|
| 3,866,061 | 2/1975 | Wen et al. | 365/203 |
| 4,090,096 | 5/1978 | Nagami | 365/194 |
| 4,162,540 | 7/1979 | Ando | 365/194 |

Primary Examiner—Stuart N. Hecker
Attorney, Agent, or Firm—Arthur J. Torsiglieri

[57] ABSTRACT

An MOS dynamic random access memory (RAM) includes an array of memory cells arranged in rows and columns. The array is divided into two or more sub-arrays. During an operating cycle latching of the sense amplifiers in the sub-arrays is staggered to avoid coincidence of current peaks each arising when the sense amplifiers in one of the sub-arrays are simultaneously latched. Latching takes place first in a sub-array in which a cell is selected. Recovery of the column conductors in the sub-arrays is also staggered to avoid coincidence of current peaks each occurring when one of the sub-arrays is recovered. The sub-array in which a cell is selected is recovered last.

8 Claims, 7 Drawing Figures

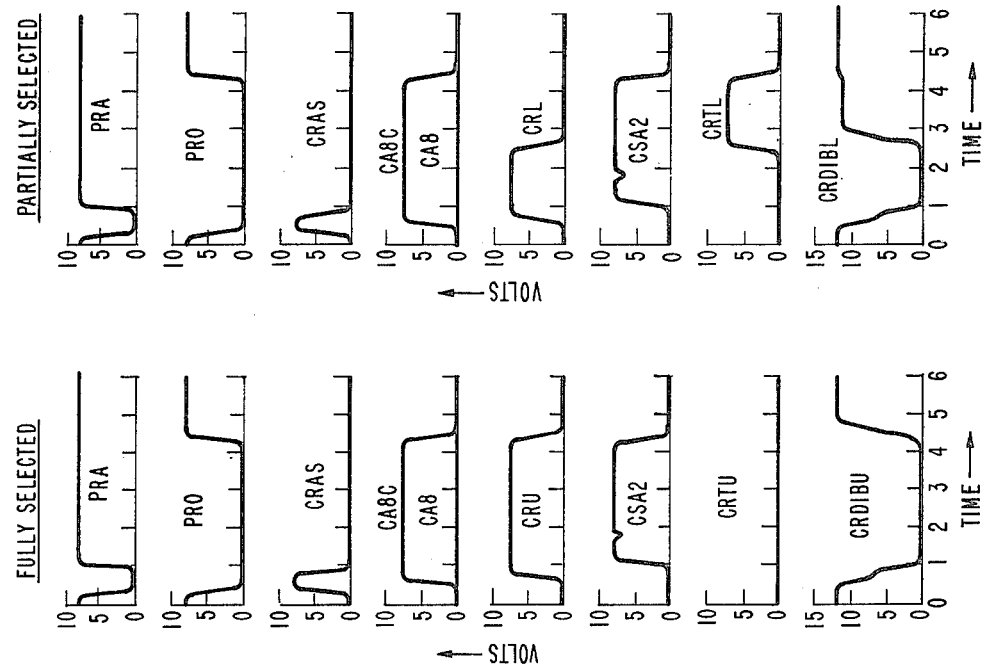
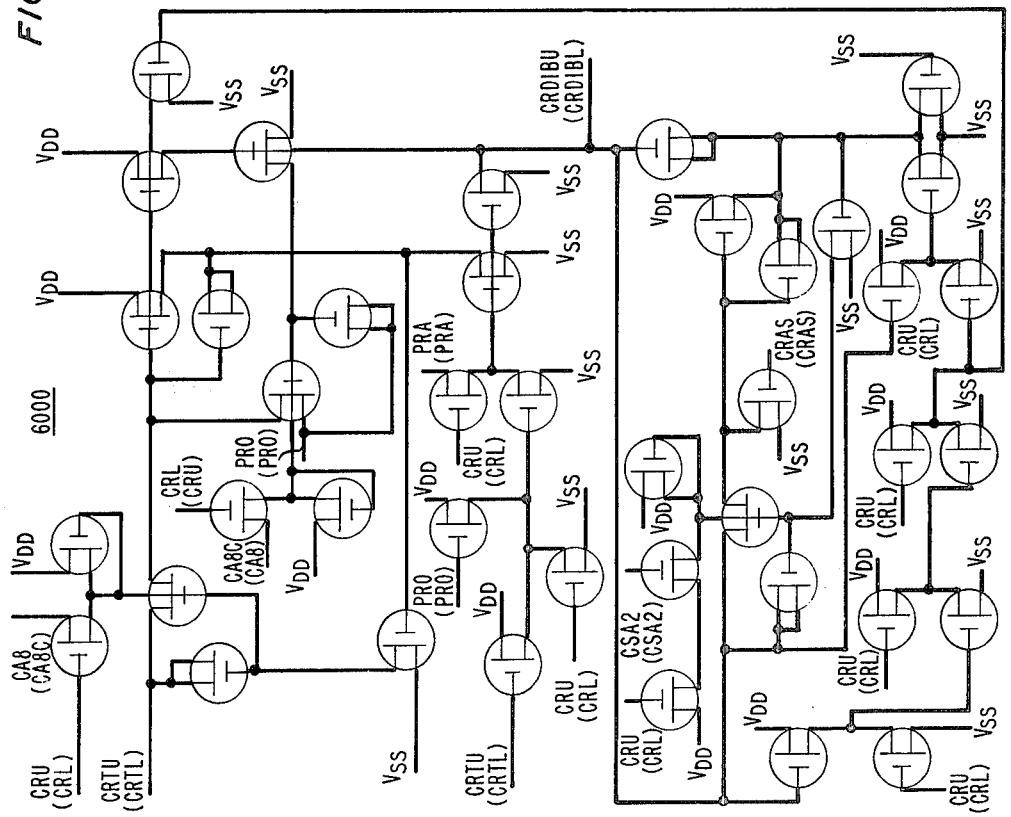
FIG. 6

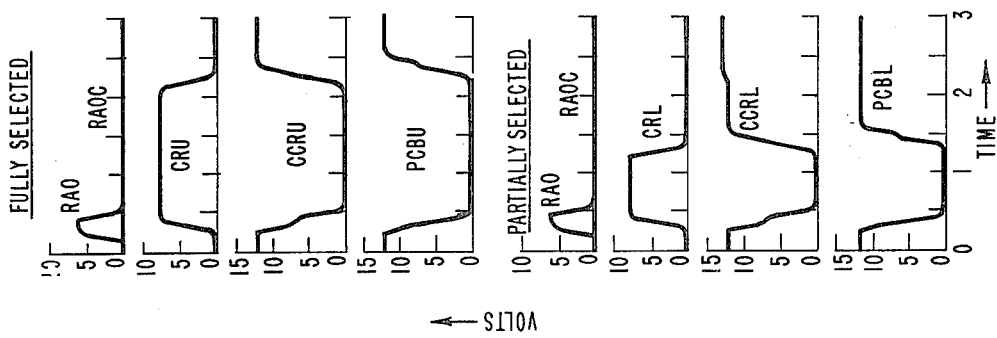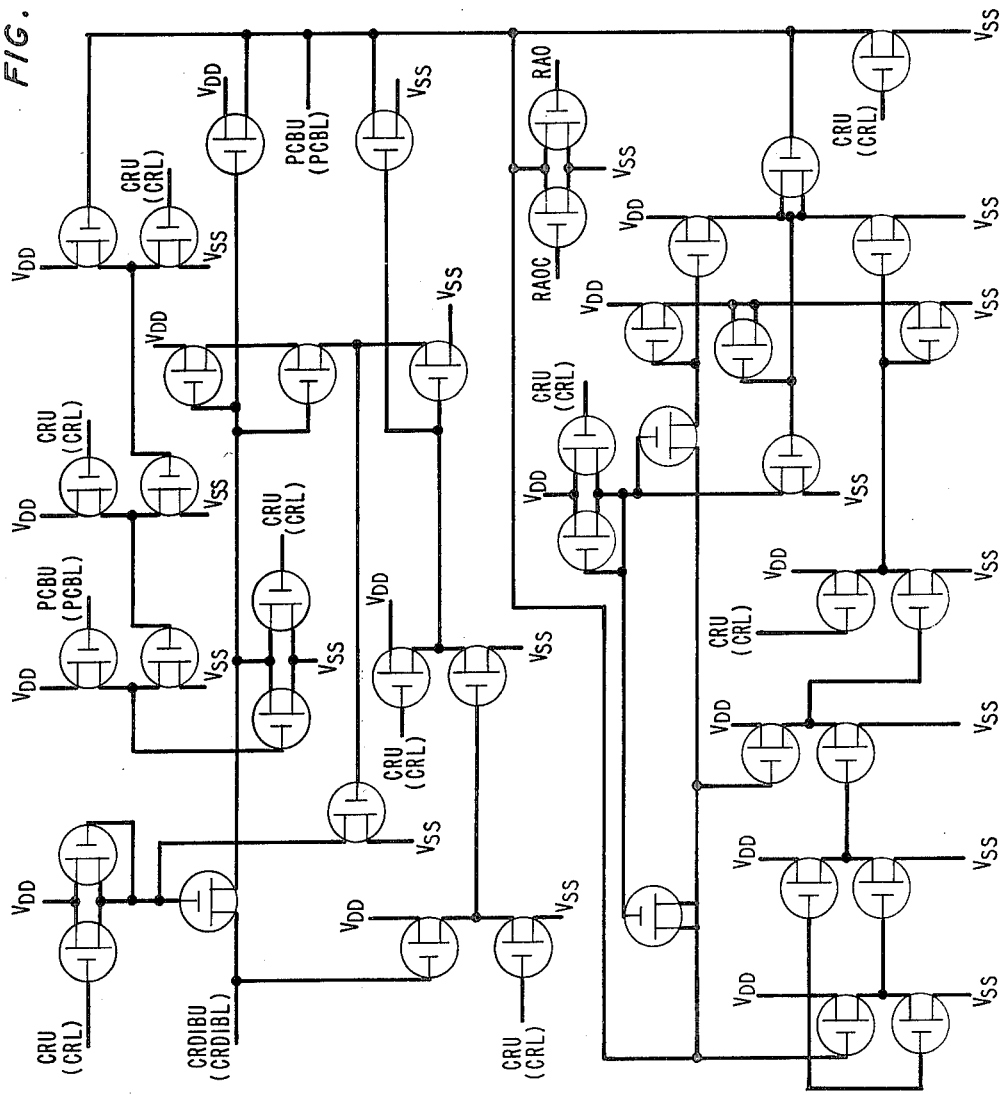

DYNAMIC RAM ORGANIZATION FOR REDUCING PEAK CURRENT

BACKGROUND OF THE INVENTION

This invention relates to semiconductor memory devices, and more particularly to an organization for a high density dynamic metal-oxide-semiconductor (MOS) random access memory (RAM) having an array of one transistor, one capacitor memory cells.

MOS dynamic RAMs are known in the art. These memories are fabricated on a single silicon chip using known MOS technologies. Typically n-channel MOS technology is used because of its inherent performance advantages. In recent years there has been a rapid evolution of MOS dynamic RAMs toward increased density and higher performance. Each new generation of RAMs has provided a four-fold increase in storage capacity over those of the previous generation. This evolution has been made possible by advances in n-channel MOS technology and in wafer patterning techniques leading toward a shrinkage in the size of the memory cell. Today MOS RAMs having a storage capacity of 16,384 bits (i.e., 16K RAMs) are commercially available. Presently, manufacturers are starting to introduce a 65,536 bit, or 64K, RAM; see *Electronics*, Sept. 28, 1978, pp. 109–116.

An example of 64K RAM is described in copending application Ser. No. 10,839, filed concurrently and having a common assignee with the instant application. In the Cenker et al RAM, the memory cell array is divided into two sub-arrays each having 128 rows and 256 columns. A two sub-array organization provides the advantage of having a refresh sequence (128 cycles) which is compatible with that of older generation RAMs by allowing simultaneous refresh of a row in each sub-array. A two sub-array organization also provides improved signals for sensing by virtue of having shorter bit-lines (column conductors) and, therefore, of reduced bit-line capacitance. In addition, the Cenker et al application discloses an arrangement for reducing power dissipation when the RAM is in a read or a write mode whereby only one of the two sub-arrays is fully selected for accessing a cell, i.e., both a row and a column are selected, while the other sub-array is partially selected for performing the refresh function only, i.e., only a row is selected. Therefore, the column decoders in the partially selected sub-array remains inactive to reduce both average and peak currents.

In dynamic memories having a large number of cells such as a 64K RAM, large transient current peaks on various conductors on the chip are a major problem. One such current peak occurs when the column conductors of the array are recovered to a precharge potential (normally VDD) after a memory function is completed. The charging of the combined capacitances of all the column conductors causes a transient surge of current on the VDD power supply lines. Insofar as increasing the number of cells in a memory also increases the total capacitance of the column conductors, the magnitude of the column precharge recovery current peak also increases with the number of cells. Another large current peak occurs when all the sense amplifiers in a sub-array are latched (i.e., activated). The discharge of the capacitances coupled to the "low-going" sense amplifier nodes causes a transient surge of current primarily on the VSS power supply lines. As the number of cells in a memory is increased, the number of sense amplifiers required is increased (as many as 512 in a 64K RAM); and, therefore, the magnitude of the latching current peak also becomes greater. Large current peaks on various conductors in the memory chip interfere with proper memory operation by causing capacitive and inductive pickup of unwanted signals on other conductors and by causing voltage drops on the power supply nodes of various circuits in the memory.

In addition to interfering with proper memory operation, large current peaks also have a deleterious effect on the reliability of the memory chip. It is well known that a metallic conductor in an integrated circuit may fail through a mechanism called electromigration. The rate of such failures is proportional to the peak current densities carried by the conductor. Therefore, from the standpoint of both proper memory operation and chip reliability it is important to minimize the peak currents in a high density dynamic RAM.

In the case of a RAM having two sub-arrays of memory cells such as the above-described 64K RAM of Cenker et al the problem becomes one of reducing peak currents in the memory while keeping both sub-arrays active for at least the cell refresh function. Prior art memory organizations using two sub-arrays have shortcomings in this regard. For example, in the 16K RAM described in *IEEE Journal of Solid State Circuits*, October 1976, pp. 570–573, By Ahlquist et al. a two sub-array RAM is operated with one of the two sub-arrays totally inactive at a given time. Thus both average and peak currents are reduced. However, such an arrangement would not permit simultaneous refreshing of a row in each sub-array or for reading and/or writing functions to take place in one sub-array while the refresh function takes place in the other sub-array.

SUMMARY OF THE INVENTION

The present invention is an improvement of the RAM organization described in the above-cited Ahlquist et al. paper in which an array of memory cells is divided into sub-arrays, and in which during a given operating cycle a cell is selected in only one sub-array. The improvements include the provision of appropriate means responsive to a part of the address for selecting a sub-array, control means for releasing the column conductors of each sub-array from the precharge potential shortly before row selection therein, means for activating in sequence the sense/refresh amplifier means in each sub-array after row selection therein beginning in the selected sub-array, the period between successive activations being sufficient for the latching current peaks caused by a prior activation to subside, the control means for recovering in sequence the column conductors in each sub-array to the precharge potential after completion of memory functions therein beginning in the non-selected sub-arrays, the period between successive recoveries being sufficient for the precharge current peak caused by a prior recovery to subside.

These improvements provide a RAM organization in which latching of the sense amplifiers in the two sub-arrays is staggered. The fully selected sub-array in which a cell is to be accessed is latched first. The partially selected sub-array is latched after a delay sufficient to allow the current peaks caused by latching in the fully selected sub-array to subside. In addition, the recovery of column conductors to a precharge potential is also staggered. The partially selected sub-array in which only the refresh function takes place is recovered first. The fully selected sub-array is then recovered after a delay sufficient to allow the current peak caused by the recovery of the partially selected sub-array to subside. Thus the peak current of the improved RAM is reduced as the current peaks from sense amplifier latching in each sub-array as well as those from column conductor recovery in each sub-array are made noncoincident.

Accordingly, it is an object of the present invention to provide an organization for a high density dynamic RAM with reduced peak current.

It is another object of the present invention to provide an organization for a high density dynamic RAM which reduces noise generation in the memory.

It is still another object of the present invention to provide an organization for a high density dynamic RAM which improves memory reliability.

The above and other objects of the invention are achieved in an illustrative embodiment described hereinafter. The novel features of the invention, both as to structure and method of operation, together with the other objects and advantages thereof will be better understood from the following description considered in connection with the accompanying drawing. It is to be expressly understood, however, that the drawing is solely for the purpose of illustration and description and is not intended to define limits of the invention.

BRIEF DESCRIPTION OF THE DRAWING

FIG. 6 is a schematic diagram of a row decoder interrupt clock generator circuit.

FIG. 7 is a schematic diagram of a column precharge clock generator circuit.

DETAILED DESCRIPTION

Figure 1:
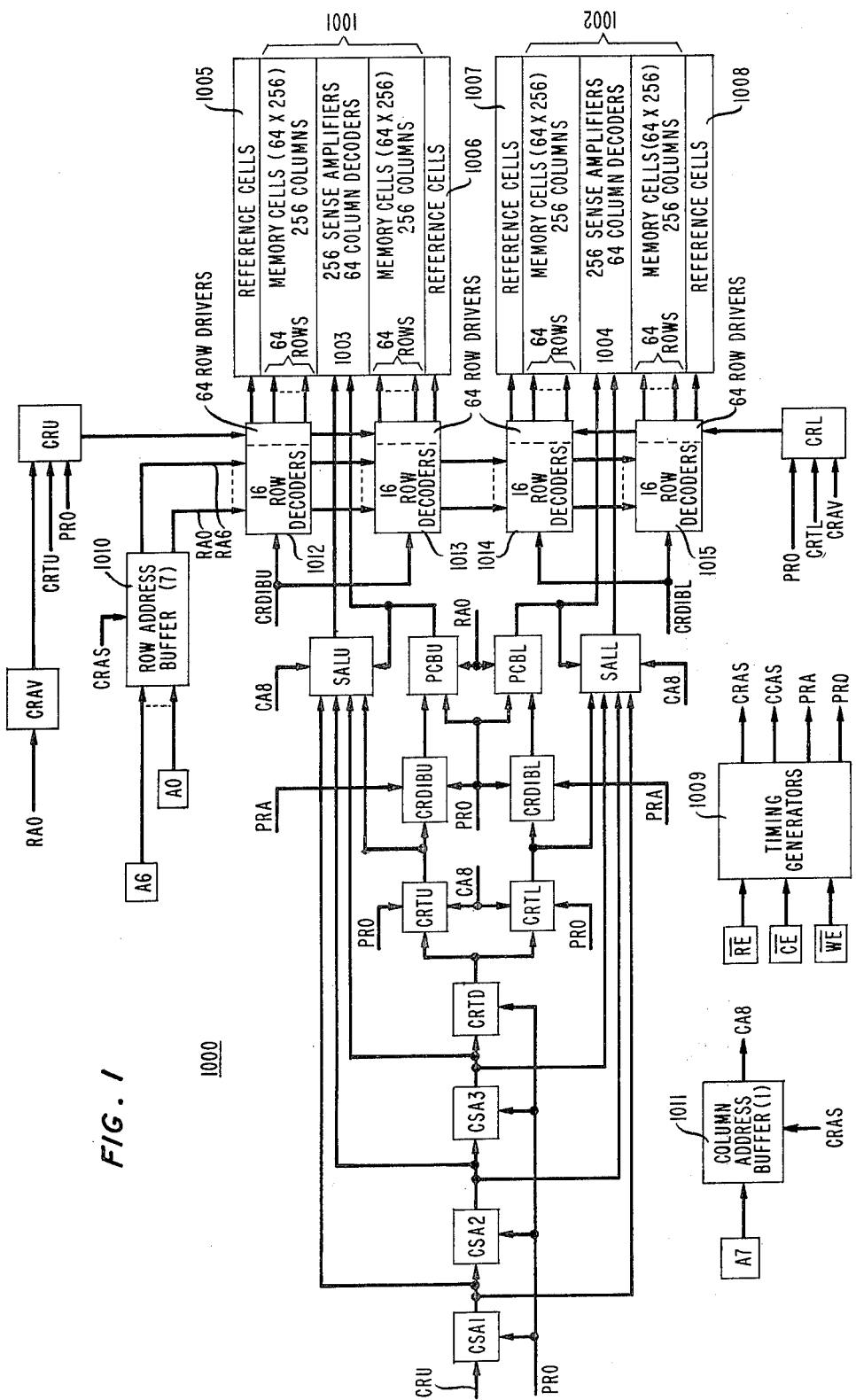
FIG. 1 is a functional block diagram of a portion of a dynamic RAM according to the instant invention.

Referring now to FIG. 1, there is shown a block diagram representative of a dynamic RAM in accordance with the instant invention. In its preferred embodiment the RAM is fabricated on a single silicon chip using n-channel MOS technology. The chip has 16 terminals or external connections; these include 8 multiplexed address input terminals A0 through A7, external voltage terminals VDD, VSS, and VBB, a data output terminal Q, a data input terminal D, a row enable clock input terminal $\overline{RE}$, a column enable clock input terminal $\overline{CE}$, and a write enable input terminal $\overline{WE}$. The VDD, VSS, VBB, Q and D terminals are not shown in FIG. 1. In normal operation the external voltages applied to the chip are: VDD=5 V, VSS=0 V, and VBB=−5 V.

The chip includes a memory cell array which is divided into two sub-arrays, an upper 1001, and a lower 1002. Each sub-array is bisected by a group of 256 sense amplifiers and 64 column decoders into two blocks each having 64 rows and 256 columns of cells to provide a total of 32,768 (32K) cells for each sub-array. The entire array has 65,536 (63K) cells. A row of 256 reference cells is also included in each block. The bisection of each sub-array being across the column conductors, two half-column conductors are created from each column conductor in the sub-array.

An operation cycle for the memory begins when a row enable signal going from a TTL "high" logic level to a TTL "low" logic level is applied to the $\overline{RE}$ input to initiate the row clocks included in the timing generators 1009 which in turn strobe the 7 row address buffers 1010 and the CA8 column address buffer 1011. An 8-bit TTL level address previously applied to inputs A0 through A7 is converted to MOS level row address signals RA0 through RA6 and column address signal CA8. The MOS address signals are all double railed, that is, both the address bits and their complements are used for row selection. Therefore, each address signal includes both the address bit and its complement. The row address signals are used by the row decoders to select one row out of 128 in each sub-array. The row decoders which also select one of two reference rows in each sub-array are partitioned into four sections 1012 through 1015, one associated with each block. Each section consists of 16 individual row decoders each serving four rows. Selection of a row in one block of a sub-array also results in the selection of the corresponding or reference row in the other block of the sub-array. The CA8 address signal is used for various steering and enabling functions to determine which sub-array is to be fully selected. A fully selected sub-array is one in which both a row and a column are selected, whereas a partially selected sub-array is one in which only a row is selected. The CA8 signal is used to gate column address signals to only the column decoders associated with the fully selected sub-array via column address gates not shown in FIG. 1.

Before row selection takes place the sub-arrays are in their standby state, and the half-column conductors in the upper and the lower sub-array are maintained at VDD by column precharge clocks PCBU and PCBL, respectively. Shortly before row selection, the half-column conductors are released from their precharge potential, the release being initiated by the row address signal RA0.

The selected rows are activated by "high" logic level signals originating from row clocks CRU and CRL and applied to the row conductors (word lines) via row drivers associated with the selected rows. A "high" logic level in the memory is a voltage which is approximately equal to or greater than VDD-VT, where VT is the threshold of voltages of the transistors. A "low" logic level in the memory is a voltage which is approximately equal to VSS. A row driver is associated with each row conductor. The row clock generators CRU and CRL are initiated by a row address valid clock signal CRAV. The row address valid clock generator which is activated by row address signal RAO provides a signal which is delayed from the RAO signal by an interval representative of the time required for the row decoders to respond to the row address signals and to complete row decoding.

Figure 4:
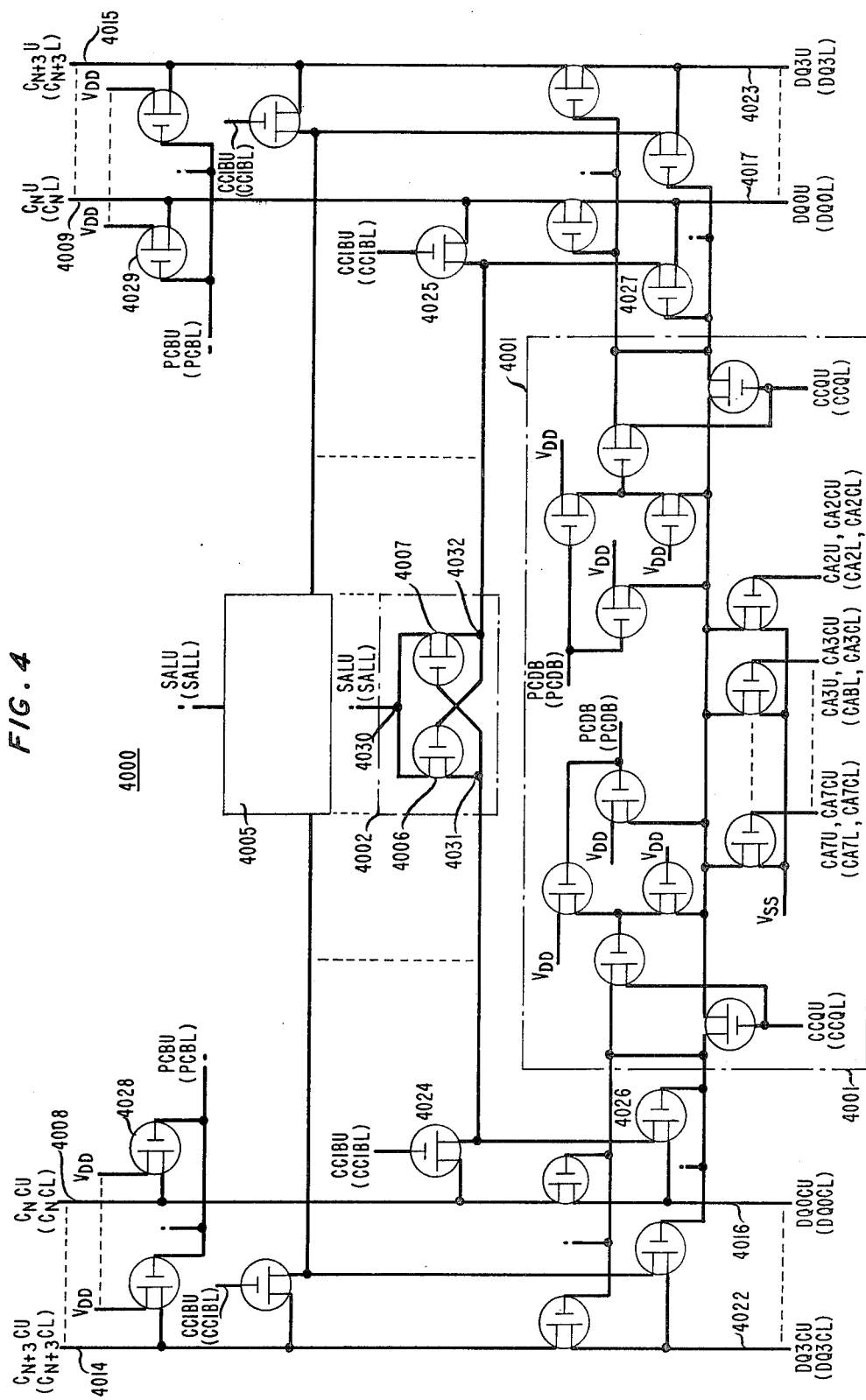
FIG. 4 is a schematic diagram of a column decoder and sense amplifier circuits.

Once the selected rows are activated, data is transferred from the memory cells and the reference cells therein to the sense amplifiers via their associated half-column conductors. The details of the interconnection between the sense amplifiers and the half-column conductors are shown in FIG. 4. The small differential voltage signal present between each pair of half-column conductors is amplified to full logic levels upon latching of the sense amplifiers. The presence of full logic level signals on the half-column conductors after the sense amplifiers are latched serves to restore full voltage levels to the memory cells of the selected rows. In this manner all the memory cells along the selected rows are automatically refreshed.

The sense amplifiers of each sub-array are latched via the sense amplifier latching circuits SALU and SALL associated with the upper and the lower sub-arrays, respectively. The sense amplifier latching circuits couple the common source node of the cross-coupled transistors (4006 and 4004 in FIG. 4) of each sense amplifier to VSS.

However, it is well known in the art that amplification of small signals in bistable differential sense amplifiers should occur at a slow rate initially to insure that the small signals are properly amplified. Once the differential voltage across the sense amplifier nodes has been amplified to VT or greater the amplification rate can be increased. Therefore, more reliable rapid amplification can be achieved by latching the sense amplifiers in two stages. In the first stage the small differential signal on the sense amplifier nodes is permitted to move slowly towards its fully amplified level. Once this differential signal has reached approximately VT a second stage of latching is initiated to complete the amplification at a more rapid rate. The first stage of latching for sense amplifiers of both sub-arrays is initiated by a first sense amplifier strobe signal CSA1. In the fully selected sub-array the second stage of latching is initiated by a second sense amplifier strobe signal CSA2 delayed from CSA1 by a time interval sufficient to allow the differential signal to reach approximately VT. In the partially selected sub-array the second stage of latching is initiated by a third sense amplifier strobe signal CSA3 delayed from CSA2 by a time interval sufficient to allow the latching current peak which occurs during the second stage of latching in the fully selected sub-array to subside. To insure that the latching current peaks do not coincide, the delay between CSA2 and CSA3 advantageously should at least be the time required for a latching current peak to fall to half of its maximum value. In the preferred embodiment, this delay is typically 20 nanoseconds.

Using as inputs the signals provided by the sense amplifier strobe clock generators CSA1 through CSA3 and under the control of column address signal CA8, the sense amplifier latching circuits SALU and SALL initiate the second stage of latching of the upper and lower sub-arrays in the proper sequence according to which sub-array is fully selected.

The third sense amplifier strobe signal CSA3 used to initiate the second stage of latching in the sense amplifiers of the partially selected sub-array is also applied to row termination clock generator CRTD. The row termination clock generator provides a signal which is delayed from CSA3 by a time interval representative of the period required for the cells in the partially selected sub-array to complete their refresh operation. The row termination clock signal CRTD is then steered to the row clock generator (CRU or CRL) associated with the partially selected sub-array. Steering is accomplished by the row termination clock gates CRTU and CRTL under the control of column address signal CA8. Therefore, the row termination clock signal is not applied to the row clock generator associated with the fully selected sub-array. The row clock termination signal causes the row clock signal applied to the row conductors of selected rows in the partially selected sub-array to recover to VSS. Thus the selected rows of the partially selected sub-array are deactivated immediately after the refresh function is completed in that sub-array.

The row termination clock signal is also applied to the row decoder interrupt clock generator (CRDIBU or CRDIBL) associated with the partially selected sub-array. In response to the row termination clock signal the row decoder interrupt clock generator produces a row decoder interrupt clock signal which is delayed from the row termination clock signal by an interval representative of the time required to deactivate the selected rows in the partially selected sub-array. The row termination clock signal is not applied to the row decoder interrupt clock generator associated with the fully selected sub-array.

The above mentioned row decoder interrupt clock signal for the partially selected sub-array is applied to the column precharge clock generator (PCBU or PCBL) associated with the partially selected sub-array to initiate recovery of all half-column conductors therein to VDD. The column precharge clock signal is also applied to the sense amplifier latching circuit (SALU or SALL) associated with the partially selected sub-array to recover the output of that circuit to VDD and thereby disable the sense amplifiers of that sub-array.

In the fully selected sub-array, once CSA2 has initiated the second stage of latching of the sense amplifiers, column selection can occur and reading and writing memory functions can take place. Details of the reading and writing memory functions are described in the above-identified Cenker et al. application.

After memory functions in the fully selected sub-array are complete, recovery of the row enable signal on the $\overline{RE}$ input terminal to the TTL "high" logic level can occur to terminate the operating cycle. Recovery of the row enable signal causes the master row precharge clock signal PRO to go to a "high" logic level. The PRO signal in turn causes termination of the row clock signal (CRU or CRL) associated with the fully selected sub-array. Thus the selected rows of that sub-array are deactivated at the end of the operating cycle. The PRO signal is also applied to the row decoder interrupt clock generator associated with the fully selected sub-array and initiates a delayed signal CRDIBU or CRDIBL therefrom. The delay introduced by CRDIBU or CRDIBL is representative of the time required for the selected rows in the fully selected sub-array to deactivate. The row decoder interrupt clock signal is applied to the column precharge clock generator (PCBU or PCBL) associated with the fully selected sub-array to initiate recovery of the half-column conductors therein. The same column precharge clock signal also initiates the recovery of the sense amplifier latching circuit associated with the fully selected sub-array and thereby disables the sense amplifiers of the fully selected sub-array. Therefore, in the partially selected sub-array the row conductors and the half-column conductors are recovered and the sense amplifiers disabled immediately after the cell refresh function is completed. Whereas, in the fully selected sub-array the row conductors and the half-column conductors are recovered and the sense amplifiers disabled upon termination of the externally applied row enable signal. Thus the large current peak associated with the recovery of each sub-array is staggered and the peak current associated with recovery in the memory is reduced. To insure that the precharge current peaks do not coincide, the delay between recoveries in the two sub-arrays should advantageously be at least the time required for a recovery peak current to fall to half its maximum value. In the preferred embodiment this delay is typically 50 nanoseconds.

In operating cycles where only the refresh function takes place, both the upper and the lower sub-arrays are partially selected. In this mode, only the $\overline{RE}$ input terminal is activated and no column selection is initiated. This operation causes row selection and staggered sense amplifier latching to occur as described above. Recovery of the two sub-arrays is also staggered in the manner described above. However, the sequence for latching and for recovery as controlled by the column address signal CA8 is unimportant in the refresh mode since both sub-arrays are only partially selected.

Figure 2:
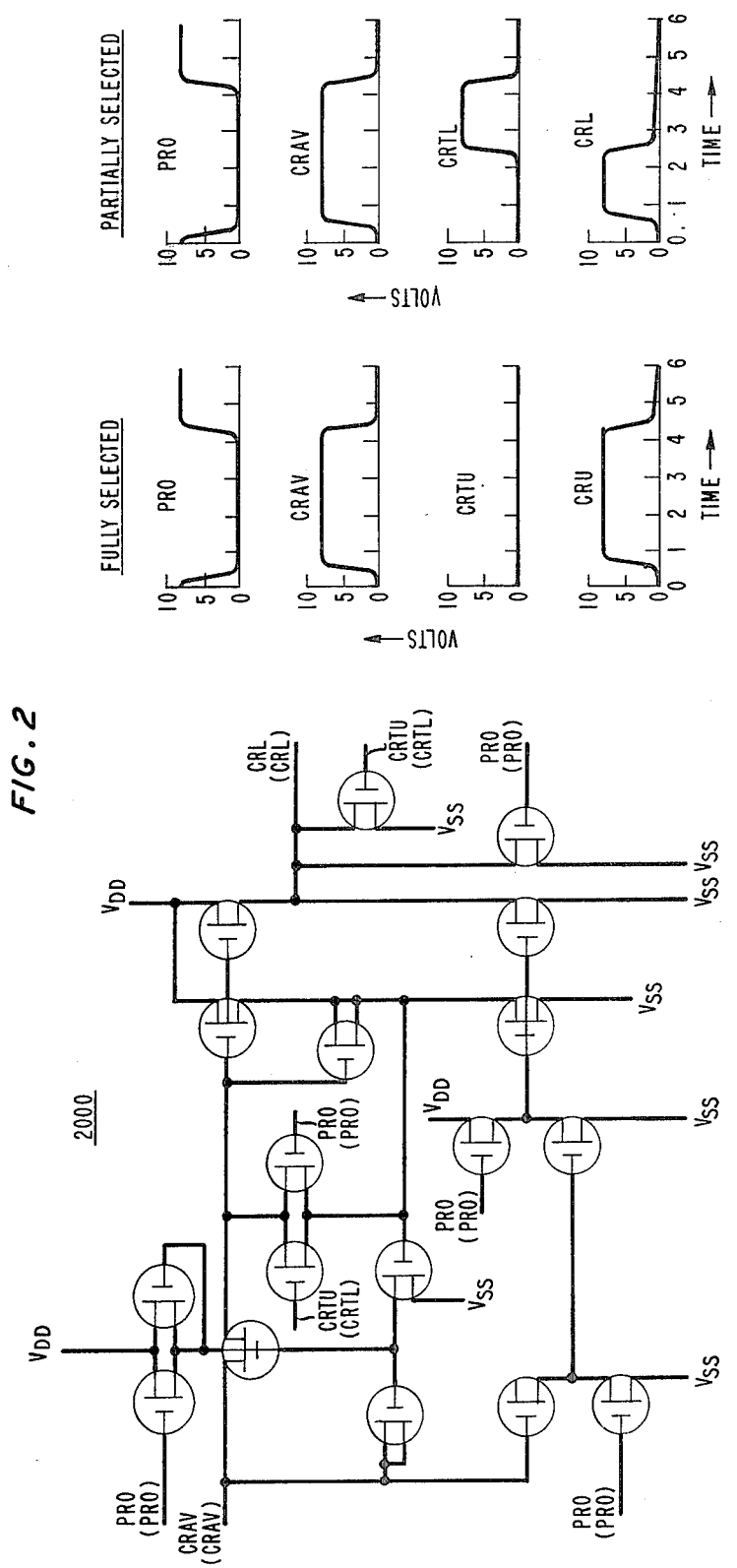
FIG. 2 is a schematic diagram of a row clock generator circuit.

Referring now to FIG. 2 there is shown a schematic diagram of the row clock generator circuit 2000. In the preferred embodiment two such circuits are used, one associated with each sub-array. The inputs and the output of the circuit associated with the lower sub-array are enclosed in parentheses. When both sub-arrays are in their standby state, the output of each circuit CRU or CRL is maintained at VSS owing to the master row precharge clock signal PRO being at the "high" logic level. At the beginning of an operating cycle, PRO goes "low" to enable the outputs to be switched "high" by the row address valid clock signal CRAV. The row address valid clock signal goes "high" when row decoding is complete causing the rise of the output of each circuit CRU and CRL to the "high" logic level. The output of each circuit remains "high" until either a corresponding row termination clock signal CRTU or CRTL or the master row precharge clock signal PRO goes "high". In the case of the circuit associated with the partially selected sub-array the row termination clock signal goes "high" before PRO. However, for the circuit associated with the fully selected sub-array the row termination clock signal has been blocked by the row termination clock gates, and its output remains output remains "high" until PRO returns "high" at the end of the operating cycle. Illustrative waveforms showing the typical behavior of the signals on the inputs and the output of the row clock generator circuits associated with the fully selected and the partially selected sub-arrays are included in FIG. 2. The waveforms are illustrative of the case where the upper sub-array is fully selected.

Figure 3:
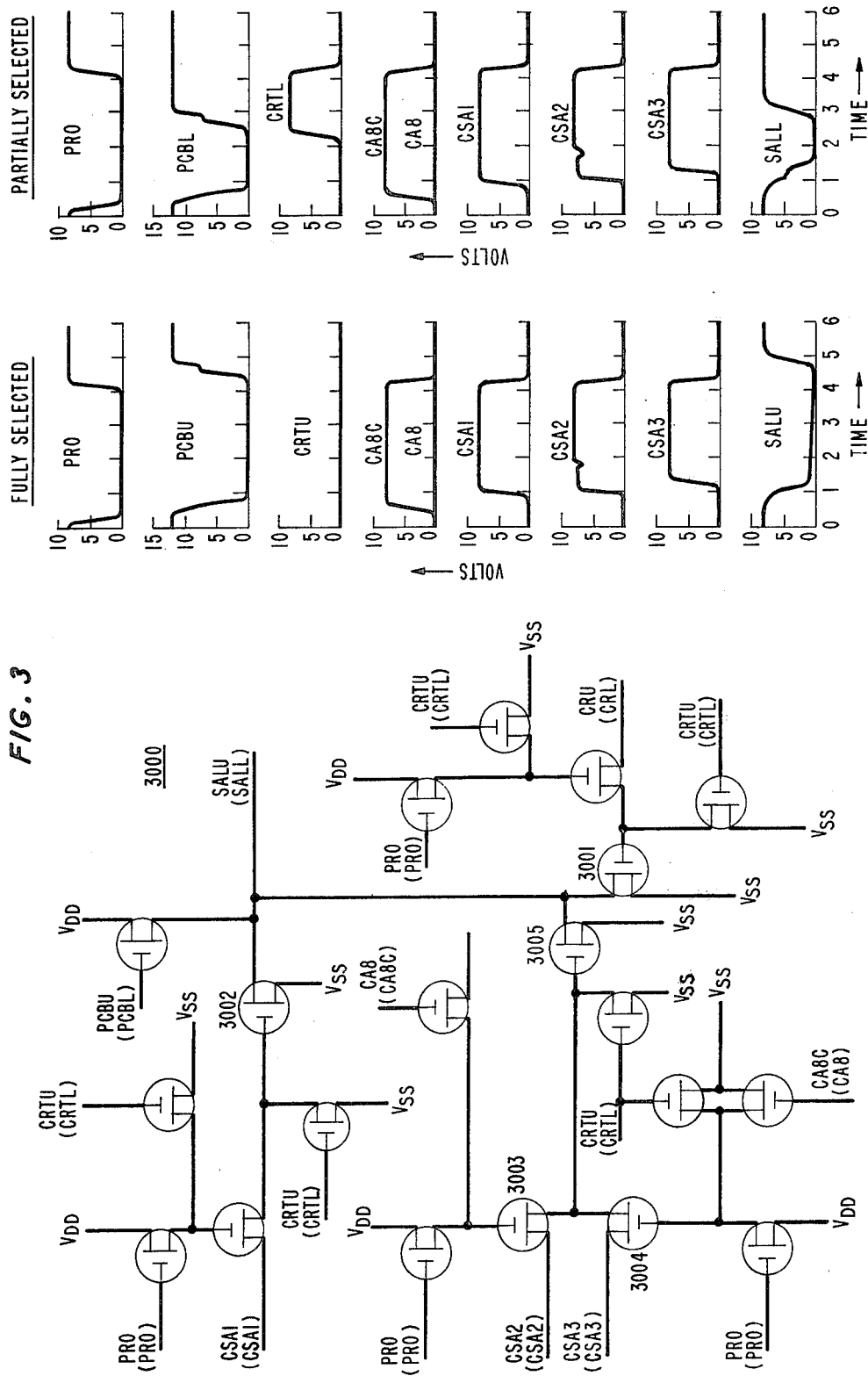
FIG. 3 is a schematic diagram of a sense amplifier latching circuit.

A schematic diagram of the sense amplifier latching circuit is shown in FIG. 3. Two such circuits are included in the preferred embodiment, one associated with each sub-array. The inputs and the output of the circuit associated with the lower sub-array are enclosed in parentheses. When both sub-arrays are in their standby state, the output of each circuit SALU or SALL is maintained at VDD by the corresponding column precharge clock signal PCBU or PCBL. The output of each circuit is coupled to the common source nodes of the sense amplifiers (4030 in FIG. 4) of the associated sub-array. At the beginning of an operating cycle the corresponding column precharge clock signal goes "low" releasing the output of each circuit. When the row clock signal CRU or CRL goes "high", transistor 3001 goes to its conducting state providing a very high impedance current path to VSS for the common source node of the sense amplifiers of the corresponding sub-array. The voltage at the common source node is forced to VDD-VT to bring the cross-coupled transistors of the sense amplifiers to the onset of conduction.

When the first sense amplifier strobe signal CSA1 goes to a "high" logic level, transistor 3002 goes to its conducting state providing a relatively high impedance current path to VSS for the output and causing the common source nodes of the sense amplifiers in each sub-array to fall towards VSS at a slow rate characteristic of the first stage of latching.

In the circuit associated with the fully selected sub-array, the state of column address bit CA8 is such that transistor 3003 is in its conducting state and transistor 3004 is in its nonconducting state when the second sense amplifier strobe signal CSA2 goes "high". Thus CSA2 causes transistor 3005 to go to its conducting state providing a relatively low impedance current path to VSS for the output and causing the output to fall to VSS at a rapid rate characteristic of the second stage of latching. When the third sense amplifier strobe signal CSA3 subsequently goes "high", its effect is blocked owing to transistor 3004 being in its nonconducting state. In the preferred embodiment transistors 3001, 2003, and 3005 have transconductances in the ratio of 5:200:1500, respectively.

In the circuit associated with the partially selected sub-array the state of column address bit CA8 is such that transistor 3003 is in its nonconducting state and transistor 3004 is in its conducting state when CSA2 goes "high". Thus, the effect of CSA2 is blocked by transistor 3003. However, when CSA3 subsequently goes "high", it causes transistor 3005 to go to its conducting state, and the sense amplifiers of the partially selected sub-array to go into the second stage of latching. Once the output of either SALU or SALL has reached VSS, it remains at that potential until the corresponding column precharge clock signal PCBU or PCBL returns to a "high" logic level, at which time the output goes to VDD. As discussed above, in connection with the recovery of the half-column conductors, the column precharge clock signal which controls the column precharge in the partially selected sub-array goes "high" before the corresponding signal of the fully selected sub-array. Corresponding row termination clock signals CRTU and CRTL are used by the sense amplifier latching circuits to eliminate dc current paths. Illustrative waveforms showing typical behavior of the signals at the inputs and the output of the sense amplifier latching circuit have been included in FIG. 3 for the case in which the upper sub-array is fully selected.

Referring now to FIG. 4, there is shown a schematic diagram of four sense amplifiers 4002 through 4005 and their associated column decoder 4001. In the preferred embodiment each column decoder is associated with four half-column conductor pairs and four sense amplifiers. A selected column decoder remains ready to transfer information on four half-column conductor pairs 4008 through 4015 to four input/output (DQ) line pairs 4016 through 4023. For simplicity FIG. 4 shows only two of the four half-column conductors pairs, two of the four sense amplifiers and two of the four DQ line pairs. A typical sense amplifier 4002 includes a pair of cross-coupled transistors 4006 and 4007 which are latched by pulling the common source node 4030 to VSS via the sense amplifier latching circuits SALU or SALL. The sense amplifier is coupled to a pair of half-column conductors 4008 and 4009 through a pair of interrupt transistors 4024 and 4025. Upon application of the corresponding data transfer clock signal CCQU or CCQL, the signals on the sense amplifier nodes 4031 and 4032 are coupled directly to the DQ line pairs 4016 and 4017 through transistors 4026 and 4027. Transistors 4028 and 4029 are used to precharge the half-column conductors 4008 and 4009 to VDD while the sub-array is in its standby state. Precharging is under the control of a corresponding column precharge clock signal PCBU or PCBL which releases the half-column conductors from their precharge potential by going "low" prior to row selection and recovers the half-column conductors to their precharged potential by going "high" when memory functions in the sub-array are completed.

Figure 5:
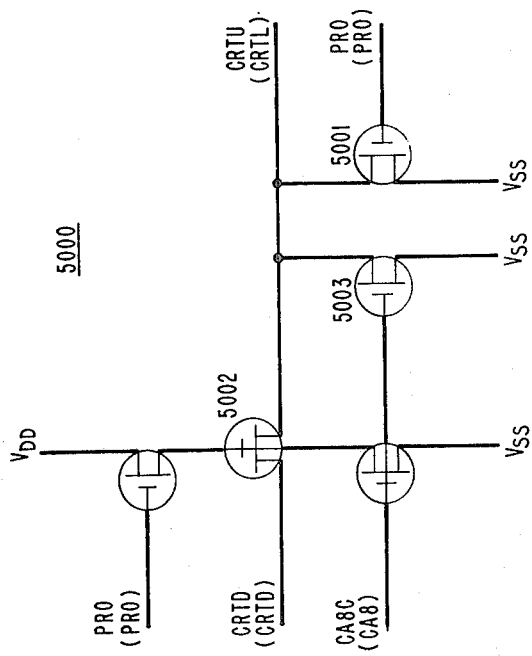
FIG. 5 is a schematic diagram of a row termination clock generator circuit.

A schematic diagram of the row termination clock gate circuit is shown in FIG. 5. In the preferred embodiment two such circuits are used to steer the row termination clock signal CRTD to the row clock generator associated with the partially selected sub-array. When the memory is in its standby state the output of each circuit CRTU or CRTL is maintained at VSS owing to PRO being a "high" logic level. At the beginning of the operating cycle, PRO which is initiated by the row enable signal going "low" causes transistor 5001 to become nonconducting. In the circuit associated with the fully selected sub-array the state of column address bit CA8 is such that transistor 5002 is in its nonconducting state when row termination clock signal CRTD goes "high". Thus the effect of CRTD going "high" is blocked by transistor 5002, and the output CRTU or CRTL is maintained at VSS by transistor 5003 which is in its conducting state owing to the state of bit CA8. In the circuit associated with the partially selected sub-array the state of column address bit CA8 is such that transistor 5002 is in its conducting state when CRTD goes "high". Thus the CRTD signal is transferred directly to the output. At the end of the operating cycle, PRO returns to a "high" logic level causing the output of the circuit associated with the partially selected sub-array to return to VSS.

Referring now to FIG. 6 there is shown a schematic diagram of a row decoder interrupt clock generator circuit. The preferred embodiment includes two such circuits, one associated with each sub-array. The inputs and the output of the circuit associated with the lower sub-array are enclosed in parentheses. When the memory is in its standby state, the output of each circuit CRDIBU or CRDIBL is at a boosted potential of greater than VDD+VT. Shortly after the row clock signals CRU and CRL go "high", the row address buffer precharge clock signal PRA also goes "high" to cause the outputs of both circuits to go "low". Under the control of column address signal CA8, the row clock termination gates CRTU and CRTL, discussed above, allow the row terminate clock signal to be applied to only the circuit associated with the partially selected sub-array. Therefore, when the row terminate clock signal goes "high" the output of the circuit associated with the partially selected sub-array returns to a boosted "high" logic level. The output of the circuit associated with the fully selected sub-array remains at a "low" logic level until the master row precharge clock PRO returns "high" at the end of the operating cycle. Illustrative waveforms representing typical behavior of the signals at the inputs and the output of the row decoder interrupt generator circuits are included in FIG. 5. The waveforms illustrate the case in which the upper sub-array is fully selected.

Referring now to FIG. 7 there is shown a schematic diagram of the column precharge clock circuit. Two such circuits are included in the preferred embodiment, one associated with each sub-array. The inputs and the output of the circuit associated with the lower sub-array are enclosed in parentheses. When the memory is in its standby state the output PCBU or PCBL of each circuit is at a boosted "high" logic level of greater than VDD+VT. When the row address bit RA0 goes "high", the output of each circuit goes "low". The output of each circuit returns to a "high" logic level when the corresponding row decoder interrupts clock signal CRDIBU or CRDIBL goes "high". As discussed above in connection with FIG. 6, the row decoder interrupt clock signal associated with the partially selected sub-array goes "high" before that associated with the fully selected sub-array. Therefore, the output of the column precharge circuit associated with the partially selected sub-array returns to the "high" logic level before that of the circuit associated with the fully selected sub-array. Illustrative waveforms representing typical behavior of the signals at the inputs and the output of the column precharge clock generator circuits are included in FIG. 7 for the case in which the upper sub-array is fully selected.

We claim:

1. A semiconductor memory device comprising a multiplicity of memory cells arranged in an ordered array of rows and columns, the array being divided into a plurality of sub-arrays, each sub-array having associated row and column decoder means responsive to an address for selecting, respectively, a row and a column in the associated sub-array, a plurality of sense/refresh amplifier means a different one associated with each column in each sub-array for sensing and/or refreshing the contents of each cell situated along a selected row, characterized in that there are included means responsive to a part of the address for selecting a sub-array, and means for activating after row selection the sense/refresh amplifier means in each sub-array in sequence beginning in the selected sub-array, the period between successive activations being sufficient for the latching current peak caused by a prior activation to subside.

2. A semiconductor memory device as recited in claim 1 wherein the period between successive activations is at least the time required for the latching current peak caused by a prior activation to fall to substantially half its maximum value.

3. A semiconductor memory device comprising a multiplicity of memory cells arranged in an ordered array of rows and columns, each row having a row conductor coupled to all cells in the row, each column having a column conductor coupled to all cells in the column, the array being divided into a plurality of sub-arrays each having associated row and column decoder means responsive to an address for selecting, respectively, a row and a column in the associated sub-array, column precharge means coupled to each column conductor for maintaining each column conductor in a sub-array at a precharge potential prior to row selection therein, characterized in that there are included means responsive to a part of the address for selecting a sub-array, and means for releasing column conductors of each sub-array from the precharge potential prior to row selection and for recovering in sequence the column conductors in each sub-array after completion of memory functions therein beginning in a non-selected sub-array, and ending in the selected sub-array, the period between successive recoveries being sufficient for the precharge current peak caused by a prior recovery to subside.

4. A semiconductor memory device as recited in claim 3 wherein the period between successive recoveries is at least the time required for the precharge current peak caused by a prior recovery to fall to substantially half its maximum value.

5. A semiconductor memory device comprising a multiplicity of memory cells arranged in an ordered array of rows and columns, each row having a row conductor coupled to all cells in the row, each column having a column conductor coupled to all cells in the column, the array being divided into a plurality of sub-arrays each having associated row and column decoder means responsive to an address for selecting, respectively, a row and a column in the associated sub-array, a plurality of sense/refresh amplifier means, a different one coupled to each column conductor in each sub-array for sensing and/or refreshing the contents of each cell situated along a selected row, column precharge means coupled to each column conductor for maintaining each column conductor in a sub-array at a precharge potential before row selection therein, characterized in that there is included means responsive to a part of the address for selecting a sub-array, control means for releasing the column conductors of each sub-array from the precharge potential shortly before row selection therein, and means for activating in sequence the sense/refresh amplifier means in each sub-array after row selection therein beginning in the selected sub-array, the period between successive activations being sufficient for the latching current peaks caused by the prior activation to subside, the control means for recovering in sequence the column conductors in each sub-array to the precharge potential after completion of memory functions therein beginning in a non-selected sub-array, and ending in the selected sub-array, the period between successive recoveries being sufficient for the precharge current peak caused by a prior recovery to subside.

6. A semiconductor device as recited in claim 5 wherein the period between successive activations is at least the time required for the latching current peak caused by a prior activation to fall to substantially half its maximum value, and wherein the period between successive recoveries is at least the time required for the precharge current peak caused by a prior recovery to fall to substantially half its maximum value.

7. A semiconductor memory device as recited in claim 6 wherein the control means deactivates the selected rows in a sub-array prior to recovering the column conductors therein.

8. A semiconductor memory device as recited in claim 7 wherein the means for activating the sense/refresh amplifier means being responsive to the control means and for deactivating the sense/refresh amplifier means in a sub-array concurrent with recovery of the column conductors in the sub-array.

* * * * *